US009537396B2

(12) United States Patent
Knoedgen (10) Patent No.: US 9,537,396 B2
(45) Date of Patent: Jan. 3, 2017

(54) POWER SWITCH CONTROL BY ADJUSTING THE BASE CURRENT OF A BIPOLAR TRANSISTOR

(71) Applicant: Dialog Semiconductor GmbH, Kirchheim/Teck-Nabern (DE)

(72) Inventor: Horst Knoedgen, Munich (DE)

(73) Assignee: Dialog Semiconductor (UK) Limited, London (GB)

(*) Notice: Subject to any disclaimer, the term of this patent is extended or adjusted under 35 U.S.C. 154(b) by 111 days.

(21) Appl. No.: 14/550,922

(22) Filed: Nov. 22, 2014

(65) Prior Publication Data
US 2015/0229214 A1   Aug. 13, 2015

(30) Foreign Application Priority Data
Feb. 11, 2014   (EP) .................................... 14154743

(51) Int. Cl.
*H02M 3/335* (2006.01)
*H02M 3/158* (2006.01)
*H03K 17/042* (2006.01)
*H03K 17/18* (2006.01)
*H03K 17/28* (2006.01)
*H02M 1/00* (2006.01)

(52) U.S. Cl.
CPC ......... *H02M 3/158* (2013.01); *H02M 3/33507* (2013.01); *H03K 17/04213* (2013.01); *H03K 17/18* (2013.01); *H03K 17/28* (2013.01); *H02M 2001/009* (2013.01); *H02M 2001/0054* (2013.01); *Y02B 70/1491* (2013.01)

(58) Field of Classification Search
CPC ........ H02M 1/08–1/096; H02M 3/325–3/3388
See application file for complete search history.

(56) References Cited

U.S. PATENT DOCUMENTS

| 6,351,107 | B1 | 2/2002 | Okita |
| 2009/0040796 | A1 | 2/2009 | Lalithambika et al. |
| 2012/0319742 | A1 | 12/2012 | Zhai et al. |
| 2015/0048755 | A1* | 2/2015 | Imanaka ........... H02M 3/33507 315/291 |

OTHER PUBLICATIONS

European Search Report 14154743.0-1809 Mailed: Jul. 4, 2014, Dialog Semiconductor GmbH.

* cited by examiner

*Primary Examiner* — Harry Behm
*Assistant Examiner* — Peter Novak
(74) *Attorney, Agent, or Firm* — Saile Ackerman LLC; Stephen B. Ackerman (57) ABSTRACT

The present document relates to Direct Current (DC) to DC power converters. In particular, the present document relates to DC to DC power converters which comprise one or more bipolar transistors as power switches. A control circuit configured to control a power switch of a switched-mode power converter is described. The power switch comprises a bipolar transistor. The control circuit is configured to determine an indication of a time instant, at which the power switch is switched off; and to adjust a basis current for controlling the power switch based on the determined indication of the time instant.

24 Claims, 6 Drawing Sheets

POWER SWITCH CONTROL BY ADJUSTING THE BASE CURRENT OF A BIPOLAR TRANSISTOR

TECHNICAL FIELD

The present document relates to Direct Current (DC) to DC power converters. In particular, the present document relates to DC to DC power converters which comprise one or more bipolar transistors as power switches.

BACKGROUND

DC to DC power converters, e.g. power converters used for LED (light emitting diode) applications, typically make use of MOSFETs (metal oxide semiconductor field effect transistors) for the high-voltage switching. The use of bipolar transistors as power switches may be beneficial in view of cost reduction. However, the control of a switching device comprising a bipolar transistor may be relatively complex.

SUMMARY

The present document addresses the technical problem of providing an efficient control circuit for a power converter comprising a bipolar transistor as a switching device. According to an aspect, a control circuit configured to control a power switch of a switched-mode power converter is described. The power converter may be a DC to DC power converter, such as a flyback power converter. The power switch comprises or corresponds to a bipolar transistor having a collector, a basis and an emitter. The collector of the power switch may be arranged in series with an inductive element (e.g. a transformer) of the power converter.

The control circuit may be configured to determine an indication of a time instant, at which the power switch is switched off. The time instant, at which the power switch is switched off, may correspond to the time instant, at which a collector current of the power switch falls to zero or crosses zero. The time instant at which the collector current falls to zero is also referred to as the "fourth" time instant in the present document. The "first" time instant may correspond to the time instant, at which a basis current is applied to the basis of the power switch, in order to switch on the power switch. The "second" time instant may correspond to the time instant, at which a basis current is interrupted and/or at which the basis of the power switch is coupled to ground, in order to initiate the switching off of the power switch.

The indication of the (fourth) time instant may be determined e.g. based on a voltage level at the inductive element. By way of example, the control circuit may be configured to determine the indication of the (fourth) time instant by detecting freewheeling of the inductive element. For this purpose, the inductive element, e.g. the transformer, may comprise an auxiliary winding, and the indication of the time instant may be determined based on the evolution of the voltage level at the auxiliary winding. It should be noted that freewheeling detection using an auxiliary winding is only one possible way for detecting freewheeling.

The control circuit may be further configured to adjust (e.g. to regulate) a basis current for controlling the power switch based on the determined indication of the (fourth) time instant. In particular, the basis current may be adjusted based on a time interval between the second time instant, when the basis of the power switch is coupled to ground for switching off the power switch, and the fourth time instant, when the power switch is actually switched off. This time interval may correspond to the storage time of the power switch. As such, the control circuit may be configured to adjust the basis current for controlling the power switch (notably for switching on and/or for maintaining on the power switch) based on a determined indication of the storage time of the power switch. By doing this, the storage time of the power switch may be regulated to a pre-determined delay. Hence, the control circuit may be configured to adjust the basis current such that the storage time of the power switch is regulated to a pre-determined delay.

The regulation of the basis current may occur across a plurality of commutation cycles. In particular, during the on-time of the power switch within a first commutation cycle, the basis current may be set, and subsequently, the storage time within the first commutation cycle may be determined, wherein this storage time is typically dependent on the level of the set basis current. The storage time within the first commutation cycle may then be used for adjusting the basis current for the subsequent second commutation cycle. If the storage time within the first commutation cycle is above the pre-determined delay, the basis current may be reduced and vice versa. This process of determining the indication of the fourth time instant within a first commutation cycle (i.e. of determining the indication of the storage time within the first commutation cycle) and adjusting the basis current for the subsequent second commutation cycle based on the indication of the storage time within first commutation cycle may be repeated for a sequence of commutation cycles.

By fixing the storage time of the power switch to a pre-determined delay, the pre-determined delay for switching off the power switch may be taken into account by the control algorithm of the power switch and of the power converter. In particular, the fixing of the storage time allows the power converter to be operated in accordance to pre-determined peak levels of the collector current, because the increase of the collector current during the storage time may be taken into account in a reliable manner Hence, the regulation of the basis current based on the indication of the time instant at which the power switch switches off, allows the provision of a power converter comprising a bipolar transistor, thereby reducing the costs of such a power converter, while at the same time allowing for a reliable power conversion.

As indicated above, the inductive element may comprise a transformer with a primary winding and an auxiliary winding. The primary winding and the auxiliary winding may be magnetically coupled (e.g. using a common magnetic core of the transformer). The primary winding may be arranged in series with the collector of the power switch. Furthermore, the transformer may comprise a secondary winding (which is magnetically coupled to the primary winding) for providing electrical power to an output of the power converter.

The control circuit may be configured to determine the indication of the time instant based on a signal (e.g. a voltage) sensed at the auxiliary winding. For this purpose, the control circuit may comprise an auxiliary pin, which may be coupled to the auxiliary winding of the transformer. In particular, the control circuit may be configured to detect the time instant of a peak or a transient of the signal sensed at the auxiliary winding. The time instant of such a peak or transient may correspond to the time instant, at which the power switch is actually switched off Hence, the use of an auxiliary winding of a transformer may be an efficient means for determining the indication of the time instant, at which the power switch is actually switched off (i.e. at which the power switch is actually opened).

The control circuit may comprise a current source configured to contribute to or to provide the basis current. In other words, the current source (also referred to as the first current source in the present document) may be configured to provide at least part of the basis current. The control circuit may be configured to control the current source in order to adjust the basis current, based on the determined indication of the (fourth) time instant. The control circuit may comprise a so called freewheeling controller for this purpose. As a result, the control circuit may be configured to control the basis current in an efficient manner.

The control circuit may comprise a high side control switch (comprising e.g. a transistor, such as a MOS transistor) configured to couple a control pin of the control circuit to the current source. In particular, the control circuit may be configured to couple the current source to the basis of the power switch via the control pin, at a first time instant, in order to switch on (i.e. to close) the power switch. Furthermore, the control circuit may comprise a low side control switch (comprising e.g. a transistor, such as a MOS transistor) configured to couple the control pin to ground. In particular, the control circuit may be configured to close the low side control switch at the second time instant, in order to initiate the switching off of the power switch. Due to the storage time of the power switch, the actual switch-off of the power switch is typically delayed by the storage time. The high side control switch and the low side control switch may be closed in a mutually exclusive manner, e.g. in accordance to a commutation cycle rate, for operating the power converter. The conversion ratio of the power converter may be controlled by modifying the duty cycle of the power switch within a sequence of commutation cycles.

The control circuit may be configured to determine an indication of an emitter current of the power switch. For this purpose, the control circuit or the power converter may comprise current sensing means which comprise e.g. a resistor. The indication of the emitter current may correspond to the voltage drop at the resistor. Furthermore, the control circuit may be configured to determine an indication of the collector current of the power switch based on the indication of the emitter current. Typically, the emitter current corresponds to the sum of the collector current and the basis current. As such, the control circuit may be configured to determine the indication of the collector current of the power switch by compensating the indication of the emitter current using the basis current. In particular, the indication of the collector current may be determined by subtracting a compensation value from the indication of the emitter current, wherein the compensation value is proportional to the basis current. The proportionality factor may depend on the resistance of the resistor used by the current sensing means. The control circuit may comprise a current source for compensating the indication of the emitter current using the basis current.

As such, the control circuit may be configured to provide an indication of the collector current in an efficient and precise manner. The collector current typically corresponds to the current through the inductive element. As such, the indication of the collector current, which corresponds to an indication of the inductor current, may be used for controlling the commutation cycle rate and/or the duty cycle of the power switch.

The control circuit may be configured to determine the indication of the collector current of the power switch by offsetting the indication of the emitter current with a storage offset. The storage offset may be dependent on a characteristic (e.g. the inductance) of the inductive element. Alternatively or in addition, the storage offset may be dependent on the (regulated) storage time of the power switch. By offsetting the indication of the collector current and/or the indication of the emitter current by the storage offset, the increase of the collector current, which occurs between the second time instant and the fourth time instant, i.e. which occurs within the storage time, may be taken into account within the regulation loop and/or within the control algorithm of the power converter in an efficient manner.

The control circuit may comprise at least two storage & hold circuits configured to sense and store a gradient of the indication of the emitter current. The gradient of the indication of the emitter current may be dependent on the characteristic (e.g. the inductance) of the inductive element. The storage offset may be proportional to the gradient of the indication of the emitter current. The proportionality factor may be dependent on the (regulated) storage time. The two storage & hold circuits may be operated to store and hold two samples of the indication of the emitter current at two different time instants T1 and T2. The two different time instants T1 and T2 may be separated by the (regulated and/or constant) storage time of the power switch.

The control circuit may further comprise a comparator which is configured to compare the (possibly offset) indication of the collector current to a reference voltage. The output of the comparator may provide a trigger for the control circuit to interrupt the basis current (e.g. by closing the low side control switch and by opening the high side control switch). Hence, the output of the comparator may be indicative of the second time instant.

The control circuit may comprise a sensing pin for receiving the indication of the emitter current (e.g. for being coupled to the current sensing means). Furthermore, the control circuit may comprise a capacitive divider (comprising e.g. a first and a second capacitor which are arranged in series). The capacitive divider may be coupled to the sensing pin via a sensing switch (comprising e.g. a transistor, such as a MOS transistor). The control circuit may be configured to maintain closed the sensing switch for a time interval corresponding to the (regulated and/or constant) storage time of the power switch. As a result of this, a voltage level at a midpoint of the capacitive divider may be indicative of an increase of the collector current of the power switch, which is caused by the storage time of the power switch. This voltage level may be provided to a controller of the control circuit, for determining the second time instant.

According to a further aspect, a power converter configured to convert electrical power at an input voltage into electrical power at an output voltage is described. The power converter may be or may comprise a DC to DC power converter. The power converter comprises an inductive element (e.g. a transformer) and a power switch which is arranged in series with the inductive element. The power switch comprises a bipolar transistor. Furthermore, the power converter comprises a control circuit as described in the present document for controlling the power switch.

According to another aspect, a method for operating a control circuit as outlined in the present document is described. The method may comprise steps which correspond to the features of the control circuit described in the present document. In particular, the method comprises determining an indication of a time instant, at which the power switch is switched off. Furthermore, the method may comprise adjusting (e.g. regulating) a basis current for controlling the power switch based on the determined indication of the time instant.

According to a further aspect, a software program is described. The software program may be adapted for execution on a processor and for performing the method steps outlined in the present document when carried out on the processor.

According to another aspect, a storage medium is described. The storage medium may comprise a software program adapted for execution on a processor and for performing the method steps outlined in the present document when carried out on the processor.

According to a further aspect, a computer program product is described. The computer program may comprise executable instructions for performing the method steps outlined in the present document when executed on a computer.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner. Also, in this document, the term "basis" is used to refer to the "base" of a bipolar transistor.

BRIEF DESCRIPTION OF THE DRAWINGS

The invention is explained below in an exemplary manner with reference to the accompanying drawings, wherein.

DESCRIPTION

Figure 1:
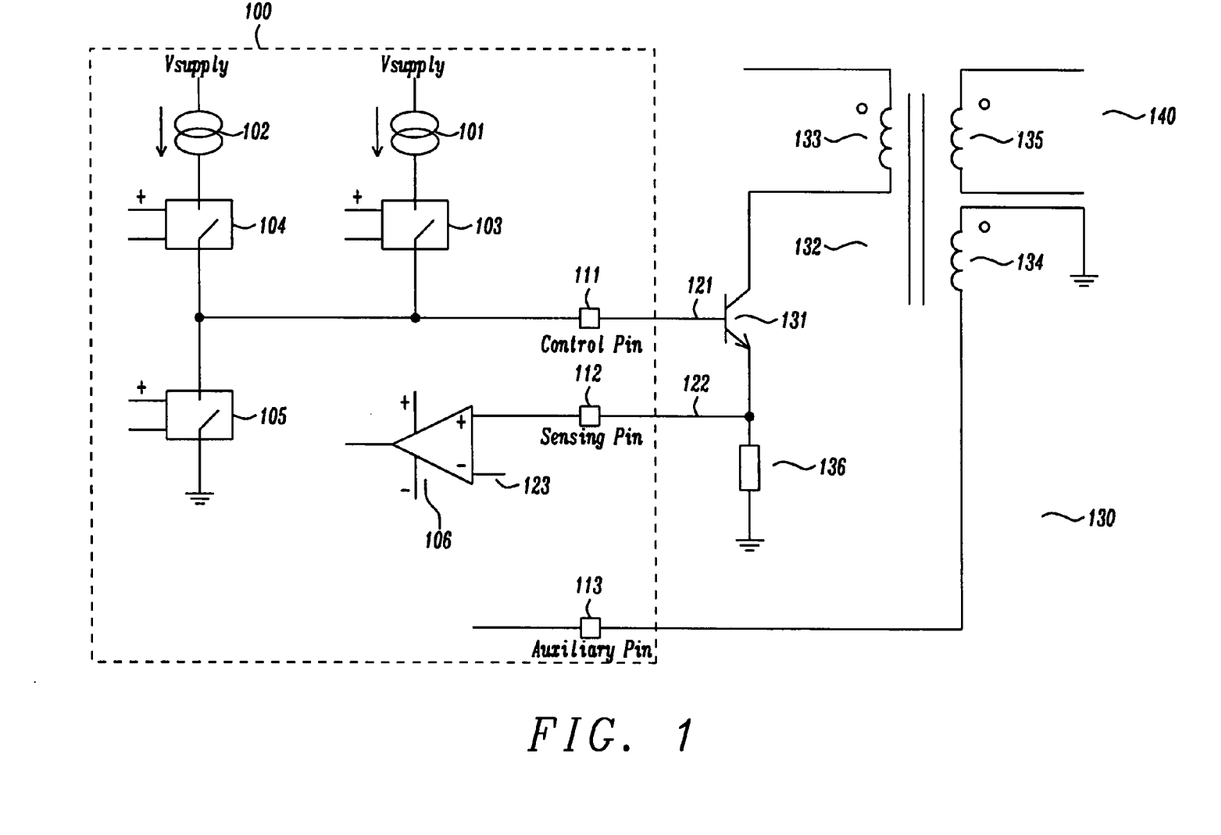
FIG. 1 shows a block diagram of an example control circuit for a power converter comprising a bipolar transistor as a switching device.

As indicated above, the present document addresses the technical problem of operating or controlling a power converter which comprises a bipolar transistor as a switching device. FIG. 1 shows a block diagram of excerpts of an example power converter 130 comprising a bipolar transistor 131 as a power switch. The bipolar transistor 131 is arranged in series with an inductive element 132, e.g. a transformer. In particular, the bipolar transistor 131 is arranged in series with the primary winding 133 of transformer 132. The secondary winding 135 of the transformer 132 is arranged in parallel to a load 140, e.g. to a light emitting diode, LED. The transformer 132 may further comprise an auxiliary winding 134. The auxiliary winding 134 may be used e.g. for freewheeling detection of the primary winding 133 of the transformer 132.

The collector of the bipolar transistor 131 may be coupled to the primary winding 133, such that the collector current Ic of the bipolar transistor 131 corresponds to the coil current through the primary winding 133 of the transformer 132. Furthermore, the bipolar transistor 131 may be controlled, i.e. may be opened or closed, subject to a basis current Ib 121 at the basis of the bipolar transistor 131. In addition, the power converter may comprise current sensing means 136, comprising e.g. a resistor, which are configured to provide an indication 122 of the emitter current Ie at the emitter of the bipolar transistor. The emitter current Ie typically corresponds to the sum of the collector current Ic and the basis current Ib 121, i.e. Ie=Ic+Ib. The indication 122 of the emitter current Ie may correspond to the voltage drop at the resistor 136.

As indicated above, the bipolar transistor 131 may be controlled via its basis. FIG. 1 shows a control circuit 100 comprising a control pin 111 which may be coupled to the basis of the bipolar transistor 131. Furthermore, the control circuit 100 may comprise a sensing pin 112 which may be coupled to the current sensing means 136 and an auxiliary pin 113 which may be coupled to the auxiliary winding 134 of the transformer 132.

Furthermore, the control circuit 100 may comprise a first high side control switch 104 which may be closed in order to couple the control pin 111 to a first current source 102 which is configured to provide parts or all of the basis current Ib 121 for putting the bipolar transistor 131 into the on-state, i.e. for closing the bipolar transistor 131. Furthermore, the control circuit 100 may comprise a first low side control switch 105 which may be closed in order to couple the control pint 111 to ground for putting the bipolar transistor 131 into the off-state, i.e. for opening the bipolar transistor 131.

The control circuit 100 of FIG. 1 comprises a second high side switch 103 and a second current source 101 arranged in parallel to the first high side switch 104 and the first current source 102. The current which is provided by the second current source 101 may be used to increase the basis current Ib 121 when first closing the bipolar transistor 131. As such, the second current source 101 may be used to increase the speed for closing the bipolar transistor 131, i.e. the second current source 101 may be used for a fast switch-on of the bipolar transistor 131.

The current gain Hfe, i.e. the ratio of the collector current Ic to the basis current Ib, of the bipolar transistor 131 may be in the range of 10. The transistor 131 may be used for start-up of the control circuit 100 and for switching of the power converter 130. Control circuitry for determining and/or for controlling the storage time (also referred to as the saturation time) of the bipolar transistor 131 will be described in the present document. For this purpose, the basis current 121 may be adjusted, e.g. using an adjustable first current source 102. Furthermore, the delay of the switch-off of the bipolar transistor 131 (i.e. the length of the storage time) may be monitored. Overall, this may be used to adjust and/or control the depth of the saturation of the bipolar transistor 131.

The control circuit 100 may be configured to determine the switch-on and/or switch-off times of the bipolar transistor 131 based on the indication 122 of the emitter current Ie. This is illustrated by the comparator 106 which may be used to compare the indication 122 of the emitter current Ie with a reference voltage 123. The output of the comparison may be used to trigger the switch-off of the bipolar transistor 131.

Figure 2:
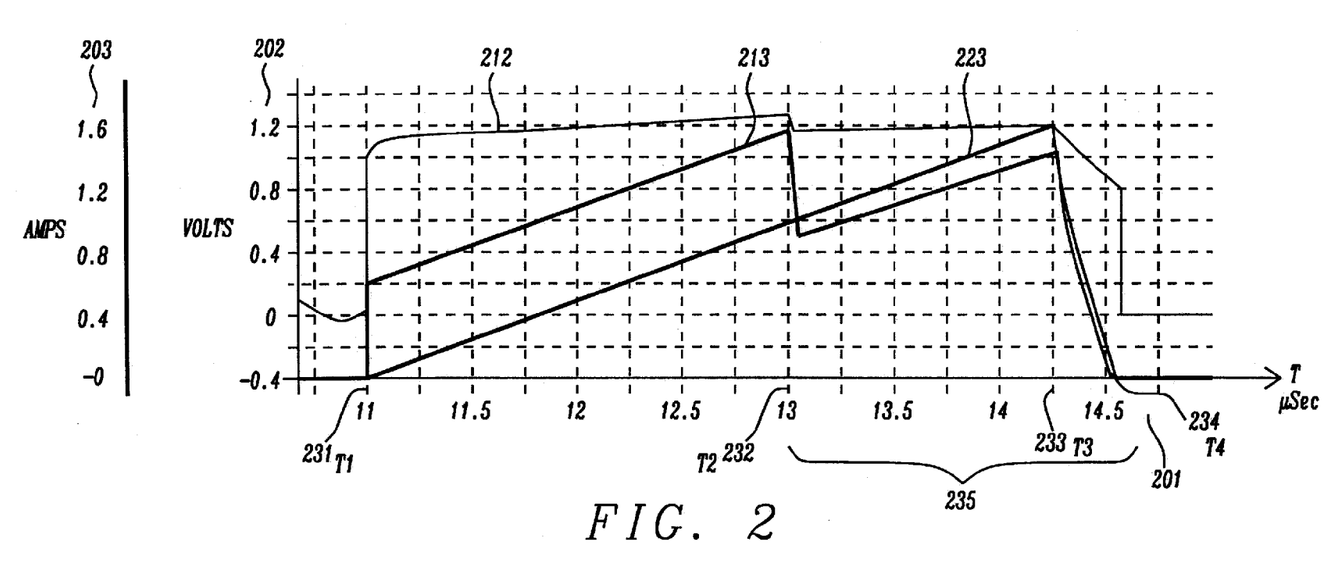
FIG. 2 shows example currents and voltages at the bipolar transistor of a power converter.

FIG. 2 illustrates an example basis voltage 212 at the basis of the bipolar transistor 131 of FIG. 1. Furthermore, FIG. 2 illustrates an example emitter current 213 at the emitter of the bipolar transistor 131, and an example collector current 223 at the collector of the bipolar transistor 131. The x-axis of FIG. 2 corresponds to the time 201 in micro seconds (μs) and the y-axis of FIG. 2 corresponds to either Volt 202 (in case of the basis voltage 212) or Ampere 203 (in case of the currents 213, 223). It can be seen that at a first time instant, T1, 231 (indicated by 11 μs on the x-axis), the basis of the bipolar transistor 131 is coupled to the first current source 102 of FIG. 1 by closing the first high side control switch 104 of FIG. 1 (and possibly to the second current source 101 by closing the second high side control switch 103). As a result of this, the basis voltage 212 and the basis current increase immediately, leading to an immediate increase of the emitter current 213. On the other hand, the collector current 223 increases continuously and/or gradually from 0 A with a pre-determined gradient or ramp. The pre-determined gradient or ramp is dependent on a characteristic (e.g. the inductance) of the inductive element 132 of FIG. 1.

At a second time instant T2, 232 (indicated by 13 μs on the x-axis), the basis of the bipolar transistor 131 is decoupled from the first current source 102 (and possibly from the second current source 101) and coupled to ground using the first low side control switch 105. This leads to an immediate drop of the basis current, and by consequence to an immediate drop of the emitter current 213. However, due to the storage effect of the bipolar transistor 131, the bipolar transistor 131 remains closed, such that the collector current 223 continues to increase in accordance to the pre-determined gradient or ramp until a third time instant T3, 233 (indicated by 14.25 μs on the x-axis). The time interval 235 between the second time instant 232 and the third time instant T3, 233 or a fourth time instant T4, 234 (when the collector current 223 reaches zero) may be referred to as the storage time or the saturation time of the bipolar transistor 131.

Only at the third time instant 233, the collector current 223 decreases due to the bipolar transistor 131 being switched off, and only at the fourth time instant T4, 234, i.e. subsequent to the storage time 235, the collector current 223 reaches or crosses zero.

Hence, it can be seen that the switch-on of the transistor 131 is relatively fast but that the switch-off of the transistor 131 is relatively slow due to the storage time 235 of the transistor 131. The storage time 235 between the second time instant 232 of the switch-off control signal and the fourth time instant 234 when the collector current 223 drops to zero is typically caused by the saturation and the discharge of the basis of the transistor 131. The collector will typically maintain a stable current, until the basis of the transistor 131 is discharged. The emitter of the transistor 131 shows the collector current and the basis current, i.e. the emitter current corresponds to the sum of the basis current and the collector current.

The storage time 235 is typically variable and may depend on the level of the basis current Ib. As indicated above, the basis current Ib may be provided (at least partially) by the first current source 102 of FIG. 1. The first current source 102 may be adjustable, i.e. the first current source 102 may be configured to provide an adjustable current for adjusting the basis current Ib 121 and for adjusting the storage time of the transistor 131.

The fourth time instant T4, 234 at which the collector current 223 drops to zero (or crosses zero) may be detected using the auxiliary winding 134 of the transformer 132 of the power converter 130 in FIG. 1. As indicated above the collector current 223 corresponds to the coil current through the primary winding 133 of the transformer 132. The drop of the coil current typically leads to a voltage increase or spike at the windings 134, 135 of the transformer 132 which may be sensed at the control circuit 100 via the auxiliary pin 113 which is coupled to the auxiliary winding 134.

Figure 3:
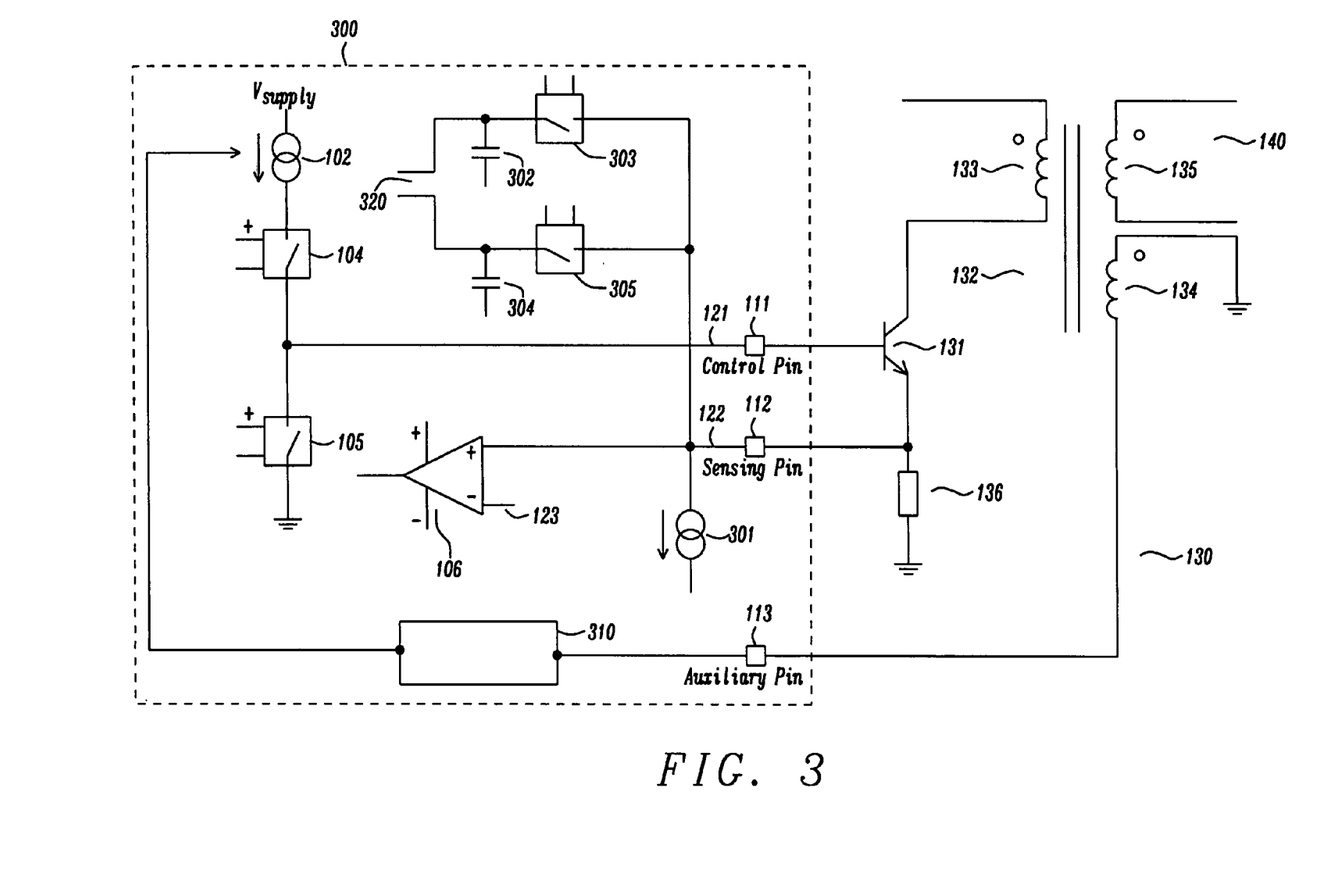
FIG. 3 shows a block diagram of an example control circuit comprising storage time determination circuitry.

In FIG. 3, the control circuit 300 may comprise a freewheeling controller 310 which is configured to detect the fourth time instant 234 based on an auxiliary signal provided by the auxiliary winding 134 of the transformer 132. The second time instant 232 (which corresponds to the time instant at which the basis of the transistor 131 is decoupled from the first current source 102 and coupled to ground via the first low side switch 105) is typically known to the control circuit 300. As a result of this, the freewheeling controller 310 may be configured to determine the storage time 235 based on the auxiliary signal provided by the auxiliary winding 134.

Furthermore, the freewheeling controller 310 may be configured to control the first current source 102 in FIG. 3 such that the storage time 235 of the transistor 131 corresponds to a pre-determined delay. Typically, an increase of the basis current 121 (i.e. an increase of the current provided by the first current source 102) leads to an increase of the storage time 235 (and vice versa). As such, the freewheeling controller 310 may be configured to control the first current source 102 to reduce the basis current 121, if it is determined that the storage time 235 lies above the pre-determined delay (and vice versa). The freewheeling controller 310 may be configured to apply a regulation algorithm (e.g. a P, I and/or D regulator) for regulating the storage time 235 to the pre-determined delay (e.g. to 500 ns up to 2 μs).

As a result of this, the storage time 235 is known to the control circuit 300 and may be compensated when controlling the bipolar transistor 131. In particular, the second time instant 232 may be advanced by the known storage time 235, such that the fourth time instant 234 (when the bipolar transistor 131 is finally switched-off) corresponds to the desired switch-off time instant of the control algorithm of the power converter 130 (which may relate to a pre-determined peak value of the collector current 223).

In other words, in order to determine a correct current measurement for controlling the power converter, a constant storage time 235 may be adjusted or regulated. As indicated above, the rise time or gradient of the collector current 223 is typically known and typically depends on parameters of the inductive element 132. Hence, the additional rise time of the collector current 223 may be taken into account during operation of the power converter 130. Furthermore, the basis current Ib 121 is typically known (and may correspond to the current provided by the first current source 102). As such, the basis current Ib 121 may be subtracted from the measured emitter current (i.e. from indication 122) to provide an indication of the collector current Ic.

The compensation of the known storage time 235 may be performed within a digital controller (not shown) of the control circuit 100. Alternatively or in addition, the compensation of the known, i.e. regulated, storage time 235 may be performed by biasing the sensed indication 122 of the emitter current 213 in an appropriate manner. The control circuit 300 of FIG. 3 comprises two sample & hold circuits (SH circuits) comprising SH capacitors 302, 304 and SH switches 303, 305, respectively. The two SH circuits may be used to determine the gradient of the collector current 223. The gradient of the collector current 223 may be determined by measuring the ramp of the emitter current 213 at two different points (as can be seen in FIG. 2, the ramp of the emitter current 213 corresponds to the ramp of the collector current 223). By way of example, a first sample of the indication 122 of the emitter current may be determined using the first SH circuit (304, 305) at time instant T1 and a second sample of the indication 122 of the emitter current may be determined using the second SH circuit (302, 303) at time instant T2. The samples may be determined by closing the respective SH switches 305, 303 at the respective time instants T1 and T2 for a pre-determined duration. The time instants T1 and T2 may be separated by the (regulated and constant) storage time. As a result of this, the offset voltage 320 between the two SH circuits provides an indication of the increase of the collector current which is caused by the storage time of the transistor 131. The offset voltage 320 may be provided to the controller of the control circuit 300 and may be taken into account for the operation of the power converter 130.

In addition, the control circuit 300 of FIG. 3 comprises a compensation current source 301 which is configured to compensate the (known) basis current comprised within the emitter current 213.

In other words, FIG. 3 shows an example control circuit 300 for a continuous operation mode of the power converter 130. The basis current may be subtracted as a constant from the indication 122 of the emitter current 213 (e.g. using the compensation current source 301). The storage time 235 of the bipolar transistor 131 may be constant (e.g. 500 ns), which may be achieved by modulating or regulating the basis current 121 of the bipolar transistor 131. Using the two SH circuits, the angle or gradient of the collector current 223/emitter current 213 may be detected and may be measured. By sampling the indication 122 of the emitter current at time instants which are separated by the storage time 235, the increase of the collector current 223 (i.e. the increase of the emitter current 213) which is due to the storage time 235 may be measured and may be provided to the digital controller of the control circuit 300. As a result of this, effects of the storage time 235 of the bipolar transistor 131 may be compensated. In particular, it may be achieved that the bipolar transistor 131 is controlled at the second time instant 232 of FIG. 2 to be effectively switched-off at a desired peak level of the collector current 223.

Figure 4:
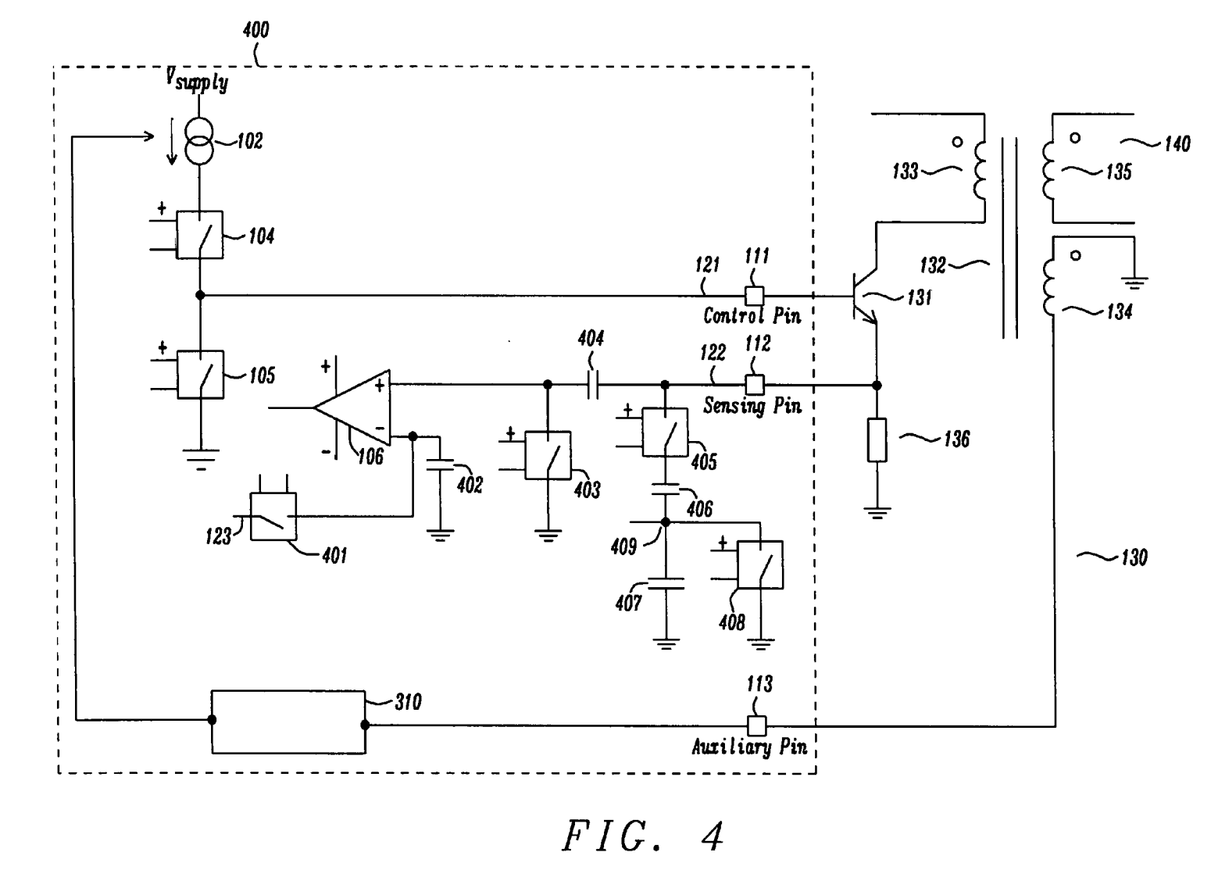
FIG. 4 shows a block diagram of another example control circuit comprising storage time determination circuitry.

FIG. 4 shows a block diagram of an example control circuit 400 which is configured to operate the power converter 130 e.g. in a discontinuous mode. In this mode the control circuit 400 can be simplified using an auto zero (AZ) system comprising an auto zero switch 403 and a capacitor 404. The capacitor 404 may be charged at the beginning of an on-phase of the bipolar transistor 131. By doing this, the basis current (which appears in the emitter current 213 immediately after switch-on of the bipolar transistor 131) may be deducted from the indication 122 of the emitter current 213, thereby providing an indication of the collector current 223.

When the transistor 131 is switched on (at the first time instant T1, 231 of FIG. 2), after a short blanking, the AZ switch 403 may be opened again. Subsequently, the capacitor 404 transfers the (modifications of the) indication 122 of the emitter current 213 transparently to the port of the comparator 106. As a result of this, the increase of the emitter current 213/collector current 223 may be monitored by the comparator 106.

Furthermore, the control circuit 400 of FIG. 4 comprises sensing circuitry for sensing the basis current and/or the amount of collector current 223 which is due to the (regulated and/or constant) storage time. The sensing circuitry comprises a sensing switch 405 for coupling a capacitive divider comprising a first capacitor 405 and a second capacitor 407 to the control pin 112. The sensing switch 405 may be closed at the first time instant 231. Alternatively or in addition, the sensing switch 405 may be kept on for a time interval corresponding to the storage time (e.g. 500 ns). As a result of this, the capacitive divider provides an indication of the amount of collector current 223 which is due to the (regulated and/or constant) storage time. The voltage at the midpoint 409 of the capacitive divider, subsequent to opening the sensing switch 405 after the pre-determined time interval corresponding to the storage time, is indicative of the amount of collector current 223 which is due to the (regulated and/or constant) storage time. This voltage at the midpoint 409 may be provided to the digital controller of the control circuit 400 (using e.g. an analog to digital converter). In particular, this voltage may be used to offset the indication of the collector current 223, in order to account for the storage time of the bipolar transistor 131, when switching off the bipolar transistor 131. The capacitances of the capacitive divider provide a pre-determined attenuation at the midpoint 409, which may be taken into account by the digital controller. A discharging switch 408 may be provided for discharging of the capacitive divider during off-phases of the bipolar transistor 131.

As such, the control circuit 400 may be adapted to compensate the basis current 121 and/or the additional current caused by the storage time 235 within the sensed indication 122 of the emitter current 213. As a result of this, a relatively precise indication of the collector current 223 may be determined by the control circuit 400. Furthermore, the bipolar transistor 131 may be controlled based on pre-determined peak levels of the collector current 223, i.e. the bipolar transistor 131 may be controlled such that the bipolar transistor 131 is effectively switched off at the time instant 233, 234, when the collector current 223 reaches a pre-determined peak level.

Figure 5:
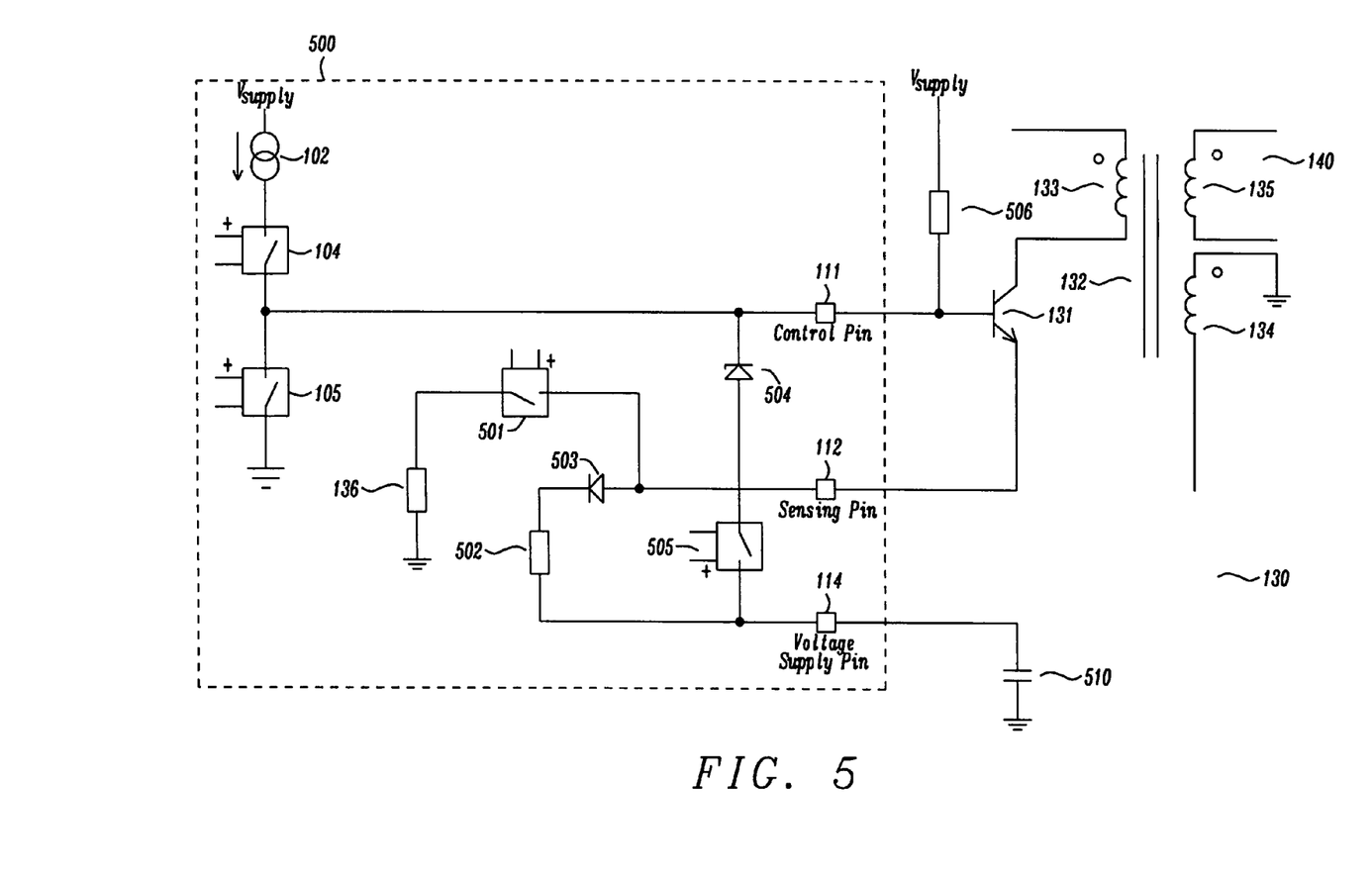
FIG. 5 shows a block diagram of an example control circuit comprising charging circuitry for a supply voltage capacitor.

The bipolar transistor 131 may be used for providing a relatively fast start-up of the control circuit 400. This is illustrated in FIG. 5, where a start-up resistor 506 is used to close the bipolar transistor 131 and to provide a start-up current to the supply voltage capacitor 510 of the control circuit 500 via the sensing pin 112, via a charging diode 503, via a charging resistor 502 and via a supply voltage pin 114 of the control circuit 500. The charging resistor 502 may be used for limiting the start-up current.

Furthermore, the current gain Hfe of the bipolar transistor 131 may be used for current limitation.

Subject to start-up, a sensing switch 501 may be closed, in order to couple the emitter of the transistor 131 to ground via the current sensing means 136. In the example of FIG. 5, the current sensing means 136 are implemented as part of the control circuit 500.

FIG. 5 also illustrates reverse protection circuitry comprising a Zener diode 504 and a switch 505. The switch 505 is typically bi-directional with no body diode. Input and output can change polarity (each side may be higher or lower than the other side).

Figure 6:
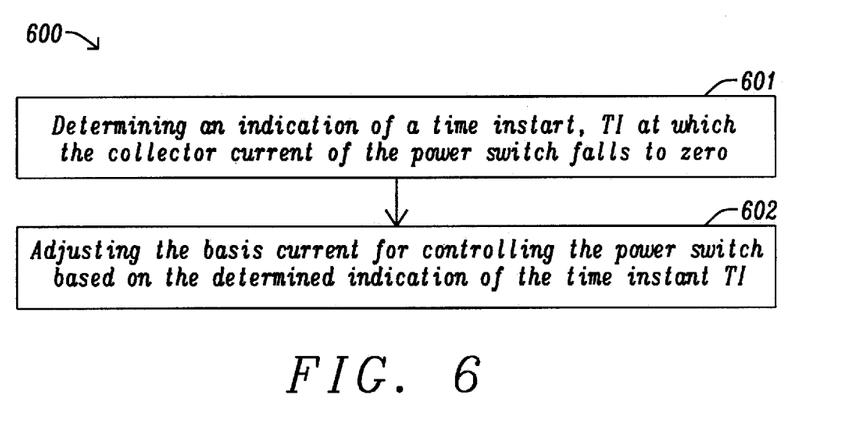
FIG. 6 shows a flow chart of an example method for controlling the bipolar transistor of a power converter.

FIG. 6 shows a flow chart of an example method 600 for controlling a power switch 131 of a switched-mode power converter 130. The power switch 131 comprises a bipolar transistor. A collector of the power switch 131 is arranged in series with an inductive element 132 (e.g. a transformer) of the power converter 130. The method 600 comprises determining 601 an indication of a time instant 234, i.e. an indication of the fourth time instant T4, 234, at which the collector current 223 of the power switch 131 falls to zero. This indication may be determined e.g. using the freewheeling controller 310. In particular, this indication may be determined based on the voltage at an auxiliary winding 134 of the inductive element 132.

The method 600 further comprises adjusting 602 the basis current 121 for controlling the power switch 131, based on the determined indication of the time instant T4, 234. As outlined in the present document, the time interval between the second time instant T2, 232 (when the basis current 121 is applied to the basis of the power switch 131 to close the power switch 131) and the fourth time instant T4, 234 (when the collector current 223 reaches or crosses zero) corresponds to the storage time 235 of the power switch 131 (i.e. of the bipolar transistor). The indication of the fourth time instant T4, 234 provides an indication of the storage time 235 of the power switch 131 (as the second time instant T2, 232 is known to the control circuit 100). As such, the basis current 121 may be adjusted 602 such that the storage time 235 of the power switch 131 corresponds to a pre-determined delay.

By regulating the storage time 235 of the power switch 131 to a constant value, the storage time 235 may be taken into account by the control scheme of the power converter 130, thereby allowing for a reliable and precise operation of the power converter 130 which comprises a bipolar transistor.

In the present document, a control circuit and a corresponding method for operating a power converter comprising a bipolar transistor have been described. The control circuit is configured to compensate the basis current and/or the storage time of the bipolar transistor, thereby allowing for a precise operation of the power converter. As a results of this, the use of power converters which comprise bipolar transistors as power switching devices is enabled, thereby allowing for the design of cost reduced power converters.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A control circuit configured to control a power switch of a switched-mode power converter; wherein the power switch comprises a bipolar transistor; wherein a collector of the power switch is arranged in series with an inductive element of the power converter: —wherein the control circuit is configured to
    determine an indication of a time instant, at which the power switch is switched off;
    adjust a basis current for controlling the power switch based on a time interval between a time instant, at which the switching off of the power switch was initiated, and the time instant, at which the power switch is switched off;
    determine an indication of an emitter current of the power switch; and
    determine an indication of a collector current of the power switch based on the indication of the emitter current by offsetting the indication of the emitter current with an offset; wherein the offset is dependent on a characteristic of the inductive element.

2. The control circuit of claim 1, wherein
    the control circuit is configured to determine the indication of the time instant by detecting freewheeling of the inductive element.

3. The control circuit of claim 2, wherein
    the inductive element comprises a transformer with a primary winding and an auxiliary winding;
    the primary winding is arranged in series with the collector of the power switch; and
    the control circuit is configured to determine the indication of the time instant based on a signal sensed at the auxiliary winding.

4. The control circuit of claim 1, wherein
    the control circuit comprises a current source configured to contribute to the basis current; and
    the control circuit is configured to control the current source to adjust the basis current, based on the determined indication of the time instant.

5. The control circuit of claim 4, wherein the control circuit comprises
    a high side control switch configured to couple a control pin of the control circuit to the current source; and
    a low side control switch configured to couple the control pin to ground.

6. The control circuit of claim 1, wherein the power switch is switched off when a collector current of the power switch falls to zero.

7. The control circuit of claim 1, wherein the control circuit is configured to adjust the basis current such that a storage time of the power switch is regulated to a pre-determined delay.

8. The control circuit of claim 1, wherein the control circuit is configured to determine the indication of the collector current of the power switch by compensating the indication of the emitter current using the basis current.

9. The control circuit of claim 1, wherein the control circuit comprises a current source for compensating the indication of the emitter current using the basis current.

10. The control circuit of claim 1, wherein the offset is dependent on a storage time of the power switch.

11. The control circuit of claim 1, wherein
    the control circuit comprises at least two sample & hold circuits configured to sense and store a gradient of the indication of the emitter current; and
    the offset is proportional to the gradient of the indication of the emitter current.

12. The control circuit of claim 1, wherein
    the control circuit comprises a sensing pin for receiving the indication of the emitter current;
    the control circuit comprises a capacitive divider coupled to the sensing pin via a sensing switch; and
    the control circuit is configured to maintain closed the sensing switch for a time interval corresponding to a storage time of the power switch, such that a voltage level at a midpoint of the capacitive divider is indicative of an increase of the collector current of the power switch caused by the storage time of the power switch.

13. A method for controlling a power switch of a switched-mode power converter; wherein the power switch comprises a bipolar transistor; wherein a collector of the power switch is arranged in series with an inductive element of the power converter; wherein the method comprises determining an indication of a time instant, at which the power switch is switched off; and adjusting a basis current for controlling the power switch based on a time interval between a time instant, at which the switching off of the power switch was initiated, and the time instant, at which the power switch is switched off;

determining an indication of an emitter current of the power switch; and determining an indication of a collector current of the power switch based on the indication of the emitter current by offsetting the indication of the emitter current with an offset; wherein the offset is dependent on a characteristic of the inductive element.

14. The method for controlling a power switch of a switched-mode power converter; wherein the power switch comprises a bipolar transistor control circuit of claim 13, wherein the control circuit determines the indication of the time instant by detecting freewheeling of the inductive element.

15. The control circuit of claim 14, wherein
a. the inductive element comprises a transformer with a primary winding and an auxiliary winding;
b. the primary winding is arranged in series with the collector of the power switch; and
c. the control circuit determines the indication of the time instant based on a signal sensed at the auxiliary winding.

16. The control circuit of claim 13, wherein
a. the control circuit comprises a current source to contribute to the basis current; and
b. the control circuit controls the current source to adjust the basis current, based on the determined indication of the time instant.

17. The control circuit of claim 16, wherein the control circuit comprises a. a high side control switch to couple a control pin of the control circuit to the current source; and
b. a low side control switch to couple the control pin to ground.

18. The control circuit of claim 13, wherein the power switch is switched off when a collector current of the power switch falls to zero.

19. The control circuit of claim 13, wherein the control circuit adjusts the basis current such that a storage time of the power switch is regulated to a pre-determined delay.

20. The control circuit of claim 13, wherein the control circuit determines the indication of the collector current of the power switch by compensating the indication of the emitter current using the basis current.

21. The control circuit of claim 13, wherein the control circuit comprises a current source for compensating the indication of the emitter current using the basis current.

22. The control circuit of claim 13, wherein the offset is dependent on a storage time of the power switch.

23. The control circuit of claim 13, wherein
a. the control circuit comprises at least two sample & hold circuits to sense and store a gradient of the indication of the emitter current; and
b. the offset is proportional to the gradient of the indication of the emitter current.

24. The control circuit of claim 12, wherein
a. the control circuit comprises a sensing pin for receiving the indication of the emitter current;
b. the control circuit comprises a capacitive divider coupled to the sensing pin via a sensing switch; and
the control circuit maintains closed the sensing switch for a time interval corresponding to a storage time of the power switch, such that a voltage level at a midpoint of the capacitive divider is indicative of an increase of the collector current of the power switch caused by the storage time of the power switch.

* * * * *